(12) United States Patent
Kamineni et al.

(10) Patent No.: US 9,356,149 B2
(45) Date of Patent: May 31, 2016

(54) SILICIDE PROTECTION DURING CONTACT METALLIZATION AND RESULTING SEMICONDUCTOR STRUCTURES

(71) Applicant: GLOBALFOUNDRIES Inc., Grand Caymay (KY)

(72) Inventors: Vimal K. Kamineni, Albany, NY (US); Ruilong Xie, Schenectady, NY (US); Robert Miller, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/795,716

(22) Filed: Jul. 9, 2015

(65) Prior Publication Data

US 2016/0005867 A1    Jan. 7, 2016

Related U.S. Application Data

(62) Division of application No. 14/146,399, filed on Jan. 2, 2014, now Pat. No. 9,111,907.

(51) Int. Cl.
| | |
|---|---|
| *H01L 29/78* | (2006.01) |
| *H01L 29/417* | (2006.01) |
| *H01L 21/285* | (2006.01) |
| *H01L 29/66* | (2006.01) |
| *H01L 23/535* | (2006.01) |
| *H01L 29/45* | (2006.01) |
| *H01L 29/49* | (2006.01) |

(52) U.S. Cl.
CPC ...... *H01L 29/7851* (2013.01); *H01L 21/28518* (2013.01); *H01L 23/535* (2013.01); *H01L 29/41791* (2013.01); *H01L 29/456* (2013.01); *H01L 29/495* (2013.01); *H01L 29/66795* (2013.01); *H01L 29/785* (2013.01)

(58) Field of Classification Search
CPC .................................................. H01L 29/41791
See application file for complete search history.

(56) References Cited

U.S. PATENT DOCUMENTS

| | | | |
|---|---|---|---|
| 5,206,187 A | 4/1993 | Doan et al. | |
| 5,920,796 A * | 7/1999 | Wang .................. | H01L 21/0276 257/E21.029 |
| 6,136,649 A * | 10/2000 | Hui .................... | H01L 21/31116 257/E21.252 |
| 6,165,880 A * | 12/2000 | Yaung ................ | H01L 21/28525 257/E21.166 |
| 6,277,738 B1 * | 8/2001 | Choi .................. | H01L 21/31116 257/E21.252 |
| 6,291,296 B1 * | 9/2001 | Hui ...................... | H01L 27/115 257/E21.682 |

(Continued)

*Primary Examiner* — Lex Malsawma
(74) *Attorney, Agent, or Firm* — Wayne F. Reinke, Esq.; Heslin Rothenberg Farley & Mesiti P.C.

(57) ABSTRACT

A semiconductor transistor has a structure including a semiconductor substrate, a source region, a drain region and a channel region in between the source region and the drain region. A metal gate, having a top conductive portion of tungsten is provided above the channel region. A first silicon nitride protective layer over the source region and the drain region and a second silicon nitride protective layer over the gate region are provided. The first silicon nitride protective layer and the second silicon nitride protective layer are configured to allow punch-through of the first silicon nitride protective layer while preventing etching through the second silicon nitride protective layer. Source and drain silicide is protected by avoiding fully etching a gate opening unless either the etching used would not harm the silicide, or the silicide and source and drain contacts are created prior to fully etching an opening to the gate for a gate contact.

10 Claims, 10 Drawing Sheets

(56) References Cited

U.S. PATENT DOCUMENTS

| | | | |
|---|---|---|---|
| 6,410,443 B1 * | 6/2002 | Avanzino | H01L 21/31053 257/E21.244 |
| 8,664,070 B2 | 3/2014 | Liu et al. | |
| 8,735,960 B2 * | 5/2014 | Tran | H01L 23/485 257/316 |
| 2012/0088345 A1 | 4/2012 | Chen et al. | |
| 2013/0049219 A1 * | 2/2013 | Tsai | H01L 21/28518 257/774 |

* cited by examiner

SILICIDE PROTECTION DURING CONTACT METALLIZATION AND RESULTING SEMICONDUCTOR STRUCTURES

CROSS-REFERENCE TO RELATED APPLICATIONS

This application is a divisional of U.S. patent application Ser. No. 14/146,399 filed Jan. 2, 2014, the entirety of which is hereby incorporated herein by reference.

BACKGROUND OF THE INVENTION

1. Technical Field

The present invention generally relates to semiconductor devices and methods of fabricating semiconductor devices. More particularly, the present invention relates to preventing damage to silicide in transistor fabrication during non-self-aligned contact metallization.

2. Background Information

Silicide processes have been widely used to form silicide contacts on gate regions and source/drain regions during the semiconductor device fabrication processing to improve the performance of the semiconductor device. The silicide layer improves the operational speed of the semiconductor device by reducing the contact resistance between the metal contact and the source, drain and gate regions.

In a typical semiconductor fabrication processing, one or more etching processes are performed simultaneously using a photoresist mask, to selectively form contacts over the silicide in source, drain and gate regions of the semiconductor device. The photoresist mask is subsequently removed by employing dry chemistries involving reactive oxygen, such as oxygen plasma. The use of oxygen plasma results in the formation of polymeric etch residues at the bottom of contact openings in source, drain and gate regions of the semiconductor device. After the oxygen plasma ash is performed, the polymeric etch residues are removed by employing prior art processes to treat the exposed silicide. However, the oxygen plasma ash processes and other prior art processes cause damage to the exposed silicide and increase the resistance of the subsequent contact metallization, resulting in degradation of the performance of the semiconductor device.

Hence, there exists a need to prevent damage to silicide during contact metallization and improve the performance of semiconductor device.

SUMMARY OF THE INVENTION

The shortcomings of the prior art are overcome and additional advantages are provided through the provision, in one aspect, of a transistor, the transistor including a semiconductor substrate, a source region, a drain region and a channel region therebetween, a metal gate above the channel region, at least a top conductive portion of the metal gate including tungsten. The transistor further includes openings through at least one layer of one or more materials to the source region, drain region and gate, and a tungsten contact filling the gate opening, the gate contact being in direct contact with the top conductive portion of the gate. The transistor further includes silicide for the source and drain regions, a liner lining only a portion that is less than all of the inner surfaces of the source and drain openings, and tungsten contacts filling the partially lined source and drain openings.

In accordance with still another aspect, an intermediate semiconductor structure is provided, including a semiconductor substrate, a source region, drain region and channel region therebetween, a metal gate above the channel region, at least a top conductive portion of the metal gate including tungsten. The intermediate semiconductor structure further includes a first layer of protective material over the source region and the drain region, and a second layer of protective material over the gate, the first protective layer acting as an etch stop for creating intermediate openings to the source region and the drain region, and the first and second protective layers are configured to allow punch-through of the first protective layer while preventing etching through the second protective layer.

In accordance with still another aspect, an intermediate semiconductor structure is provided, the semiconductor structure including a semiconductor substrate, a source region, drain region and channel region therebetween, a metal gate above the channel region, at least a top conductive portion of the metal gate comprising tungsten, openings to the source region and the drain region, silicide in the source region and the drain region, and an intermediate gate opening exposing at least a portion of a layer of protective material directly above the metal gate without exposing the metal gate.

These, and other objects, features and advantages of this invention will become apparent from the following detailed description of the various aspects of the invention taken in conjunction with the accompanying drawings.

DETAILED DESCRIPTION OF THE INVENTION

Figure 1:
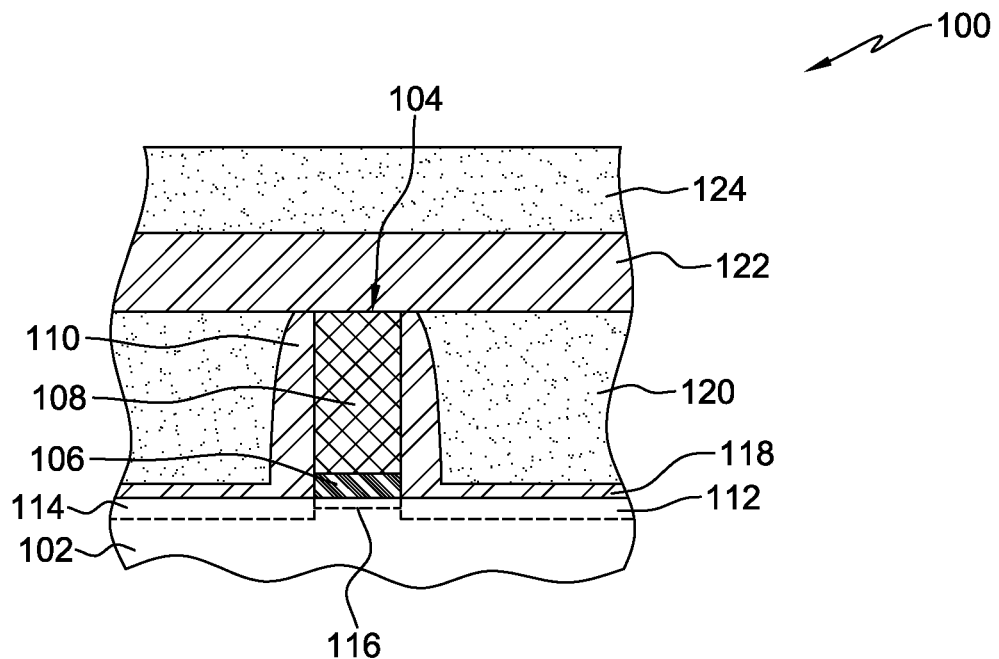
FIG. 1 is a cross-sectional elevational view of one example of a semiconductor structure including a gate structure, a source region and a drain region, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include " (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 is a cross-sectional view of one example of a semiconductor structure, generally denoted by 100, obtained at an intermediate stage of semiconductor fabrication of transistors, in this case, FinFETs. At the stage of fabrication depicted in FIG. 1, the intermediate structure 100 includes a substrate 102, such as a bulk semiconductor material, for example, a bulk silicon wafer. As one skilled in the art will understand, where, as in the present example, a bulk semiconductor material is used, many transistors will be present, such that what is shown in FIG. 1 is repeated a large number of times across the wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof. The substrate 102 may be a planar substrate, or three-dimensional, such as FINs or Nanowires.

Continuing still with FIG. 1 gate structure 104 may be disposed over substrate 102. As one skilled in art will understand, gate structure 104 may be fabricated using a conventional "gate-first" process as well as a conventional "gate-last process" (also referred to as replacement metal gate process). In one example, gate structure 104 may include a dielectric layer 106. In a specific example, dielectric layer 106 may include silicon dioxide ($SiO_2$) and may be thermally grown or deposited by a number of different processes, for example, a chemical vapor deposition (CVD) process. In another specific example, dielectric layer 106 may also include a high-k dielectric material with a dielectric constant greater than about, for instance, 3.9 (note that k=3.9 for $SiO_2$). Examples of high-k dielectric materials may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. A gate material 108 may be deposited over dielectric layer 106 and may include, for example, amorphous-silicon (a-Si) or polycrystalline silicon or silicided polycrystalline gate. In another example, gate material 108 may also include a metal gate structure, which may typically include one or more conformally-deposited work function materials such as, for example, titanium nitride (TiN), titanium aluminide (TiAl) and tantalum nitride (TaN) and low resistance conducting metal such as, for example, tungsten (W), aluminum (Al) and cobalt (Co) disposed over the one or more conformally-deposited work function materials.

Referring still to FIG. 1, spacers 110 are situated along the sides of gate structure 104. Spacers 110 are film layers (or sidewall spacers) formed along sidewalls of gate structures 104 and may be fabricated by depositing the film layers using conventional deposition processes, such as, for example, CVD, low-pressure CVD (LP-CVD), or plasma-enhanced CVD (PE-CVD) and subsequently etched using anisotropic etch processes to create spacers 110 along the sides of gate structure 104. Note that the spacers, having a conventional thickness, may include or be fabricated of a protective material, such as, for example, silicon nitride or a low-k dielectric material with a dielectric constant less than, for instance, about 3.9 (note that k=3.9 for $SiO_2$). Examples of low-k dielectric material may include, but are not limited to, silicon oxynitride (SiON) and silicon boron carbonitride (SiBCN). In a specific example, silicon nitride may be deposited using a halogen-free precursor, such as, for example, bis(t-butylamino)silane (BTBAS) ($SiC_8N_2H_{22}$) and ammonia ($NH_3$) at about 550° C.

As is understood in the art and shown further in FIG. 1, a source region 112, a drain region 114 and a channel region 116 therebetween are associated with each gate, and provided over substrate 102. The source and drain regions may be formed using any suitable techniques, including, for example, ion implantation, epitaxial growth of the embedded source/drain materials and activation anneals. By way of example, source region 112, drain region 114 and channel 116 may be part of a planar-type transistor or a FinFET situated at a top of a fin. It will be understood that the positioning of the source region and drain region may be interchanged.

A first layer of protective material 118 extends laterally over substrate 102 adjacent to the gate structure 104. Note that the first layer of protective material may generally be any film of protective material (or a hard mask) which may function as an etch stop while being configured to allow punch-through for contact with the underlying source region and drain region, as described further below. The first layer of protective material also facilitates in protecting the underlying source region 112 and drain region 114 from ionic impurities, such as $Na^+$, $K^+$ diffusing into the active region during subsequent chemical mechanical planarization (CMP) processes. Note that the first layer of protective material 118 may include a material, such as, for example, silicon nitride and may have a thickness, such as to allow punch-through, for instance, in the range of about 3 nanometers to about 20 nanometers. As used herein, the term "punch-through" refers to etching of the first layer of protective material to reach the underlying layers for subsequent processing.

Continuing with FIG. 1, a layer of a dielectric filler material 120 is shown disposed over the first layer of protective material 118, encompassing the gate structure 104 and spacers 110. In one example, dielectric layer 120, having a conventional thickness, may be, for instance, a field oxide of relatively low quality within the spectrum of available oxides. In a specific example, the field oxide may include flowable oxide, such as, for example, hydrogen silsesquioxane polymer or a carbon free silsesquioxane polymer, which may be deposited by a flowable chemical vapor deposition (F-CVD). In another example, dielectric layer 120 may include, but is not limited to, stoichiometric or non-stoichiometric silicon nitride (SiN or $Si_3N_4$), silicon oxide ($SiO_2$), or fluorinated silicate glass (FSG). A non-selective chemical mechanical polish of dielectric layer 120, may be performed to expose an upper surface of gate structure 104.

A second layer of protective material 122 may be provided over dielectric layer 120, gate structure 104 and spacers 110, as depicted further in FIG. 1. The second layer of protective material may generally be any conventional material configured, with respect to the first layer of protective material, to selectively allow punch-through of the first layer of protective material while preventing etching through the second layer of protective material. Note that the second layer of protective material may be fabricated with a material that is substantially similar to the material of the first layer of protective material, but could instead be a different material that is more etch resistant for a given etch process. In the present example, second layer of protective material 122 may include a material, such as, for example, silicon nitride, that is relatively thicker, or of a different silicon-to-nitrogen atomic ratio, than the first layer of protective material 118, so as to prevent etching therethrough to underlying gate structure 104 during subsequent fabrication involving punch-through of first layer of protective material 118 to reach the underlying layers. In one example, the thickness of second layer of protective material 122 may be in the range of about 3 nanometers to about 40 nanometers.

An additional layer 124 of dielectric material may be disposed by conventional CVD deposition over the second layer of protective material 122, as further shown in FIG. 1. Note that this additional dielectric layer advantageously facilitates subsequent patterning of the semiconductor structure to create contact openings, which in turn, facilitate formation of conductive contacts or contact metallization to electrically connect to the active regions of the transistor including, for instance, the source region, the drain region and the gate structure. Note that additional dielectric layer 124 may, for example, include a material that is substantially similar to the material of dielectric layer 120. In one example, the additional dielectric layer 124 may include flowable oxide, such as, for example, hydrogen silsesquioxane polymer or a carbon free silsesquioxane polymer, which may be deposited by a flowable chemical vapor deposition (F-CVD). In another example, additional dielectric layer 124 may include, but is not limited to, stoichiometric or non-stoichiometric silicon nitride (SiN or $Si_3N_4$), silicon oxide ($SiO_2$), or fluorinated silicate glass (FSG).

As will be subsequently explained, semiconductor fabrication processing of the semiconductor structure generally proceeds by patterning of the structure to create one or more electrically conductive contacts or contact metallization to electrically connect to the one or more gate structures, source regions and drain regions of the transistor(s). This contact metallization may be achieved by sequentially patterning the structure to create openings over the various active regions. In the present example, this patterning begins with the gate.

Figure 2:
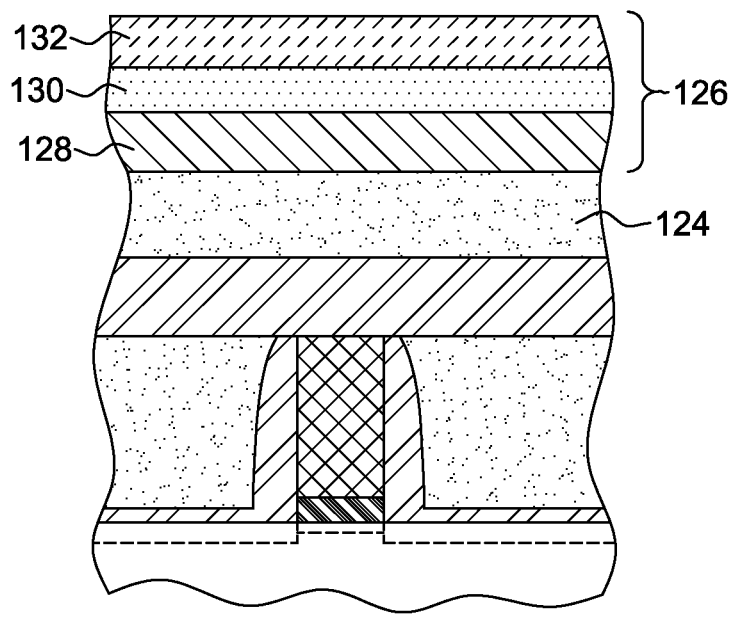
FIG. 2 depicts one example of the intermediate structure of FIG. 1 after providing a lithographic stack over the semiconductor structure, in accordance with one or more aspects of the present invention.

Accordingly, as depicted in FIG. 2, one or more lithographic processing steps may be performed to etch through the multilayer structure of FIG. 1, to create electrically conductive contacts or contact metallization to electrically connect to the gate structures. These lithographic processing steps may include providing a lithographic stack 126 over additional dielectric layer 124, as depicted in FIG. 2. As discussed herein, the lithographic stack 126 may include an organic planarizing layer (OPL) 128, an anti-reflective coating material layer 130 and a layer of photoresist 132. The organic planarizing layer 128 which is used to transfer a pattern from the overlying photoresist layer 132 in subsequent lithography processing, may be formed using conventional spin-coating processes. In one example, organic planarizing layer 128 may be any of those conventionally employed during a pattern transfer process and may include an organic polymer, for example, polyacrylate resin, epoxy resin, phenol resin, polyamide resin, polyimide resin, unsaturated polyester resin, polyphenylenether resin, polyphenylenesulfide resin, or benzocyclobutene (BCB). The thickness of the organic planarizing layer may preferably be about 50 nanometers to about 200 nanometers.

Anti-reflective coating material layer 130, which may be, for example, a silicon anti-reflective layer (Si-ARC), is deposited over organic planarizing layer 128 to minimize any pattern distortion due to reflections. Anti-reflective coating material layer 130 may include materials having silicon and nitrogen, silicon and oxygen, or silicon, oxygen and nitrogen, or an organic polymer, or combinations thereof. The thickness of the anti-reflecting coating material layer 130 may preferably be about 20 nanometers to about 40 nanometers. As is known, a layer of light sensitive material, such as, for example, photo resist layer 132, protecting the underlying layers in the direction of etching during the subsequent etch processing, is deposited over the anti-reflective coating material layer 130. The thickness of the photo resist 132 may preferably be in the range of about 60 nanometers to about 100 nanometers. The layer of photo resist 132 also defines the openings through which the etch process proceeds and may include a conventional positive photo resist material, such as, for example, organic photo resist materials, non-organic materials or combinations thereof.

Figure 3:
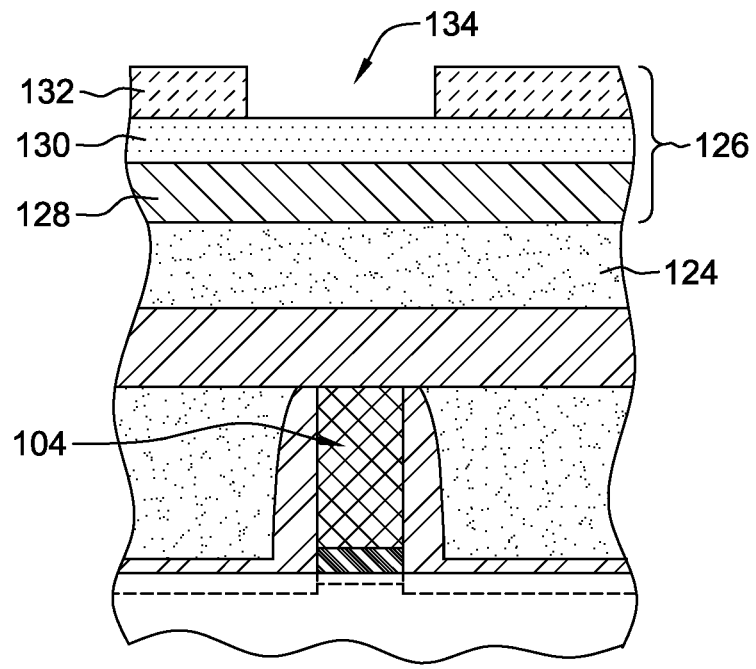
FIG. 3 depicts one example of the intermediate structure of FIG. 2 after creating a patterned opening, in accordance with one or more aspects of the present invention.

As depicted in FIG. 3, the patterning of the lithographic stack 126 may then proceed by selectively patterning to remove a portion of photo resist layer 132 over gate structure 104. By way of example, this patterning process may be performed by employing a mask (not shown). In one example, a mask may be used to expose select portions of photo resist layer 132 with an exposure source from, for instance, a conventional stepper lithography system, resulting in the polymerization of the exposed photo resist layer. The portion of the exposed photo resist layer may then be developed using conventional wet chemistry, to remove the exposed or polymerized portions and to create a pattern that includes a patterned opening 134 within photo resist layer 132, over gate structure 104.

Figure 4:
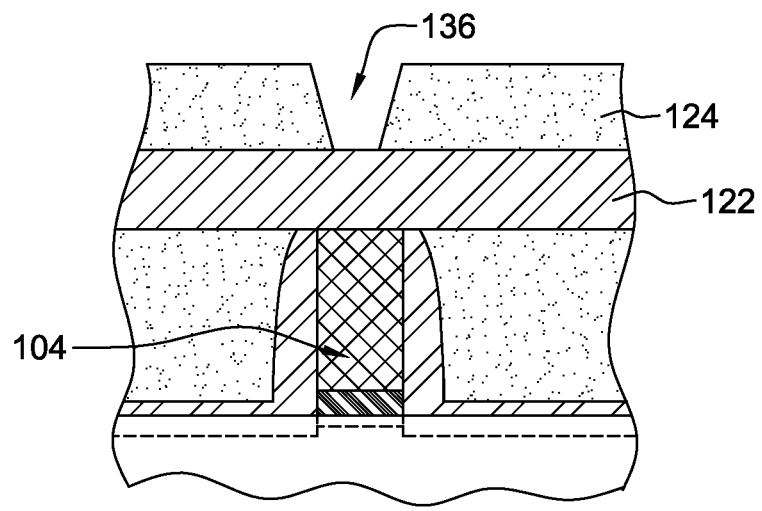
FIG. 4 depicts one example of the intermediate structure of FIG. 3 after patterning and creating an intermediate gate opening using the patterned opening, in accordance with one or more aspects of the present invention.

The patterned opening 134 in the photo resist layer may then be used as a hard mask to transfer the pattern from photo resist layer to additional dielectric layer 124, as depicted in FIG. 4, by extending downward through anti-reflective coating material layer 130 (see FIG. 3) and organic planarizing layer 128 (see FIG. 3). Note that the transfer proceeds to extend through the additional dielectric layer 124 and stopping at second layer of protective material 122, thereby creating an intermediate gate opening 136 within additional dielectric layer 124. This transfer of pattern may be performed as one or more process steps, such as, for example, an anti-reflective coating open step and an organic planarizing layer open step, followed by an etching process to create intermediate gate opening 136 within additional dielectric layer 124. Any suitable etching processes, such as, for example, wet etching or dry etching processes may be employed to create intermediate gate opening 136 within additional dielectric layer 124. The residual layers of the lithographic stack 126 (see FIG. 3), such as, for example, photo resist layer, anti-reflective coating and organic planarizing layer are subsequently removed by subjecting to dry chemistries involving reactive oxygen, such as, for example, oxygen plasma in an ashing environment. In another example, the ashing environment may also include water vapor and a gaseous fluorocarbon or a fluorinated hydrocarbon gas. Although not depicted in the figures, note that after the initial intermediate gate opening over the gate structure has been created, any subsequent intermediate gate openings over any additional gate structures may be created by protecting the initially created intermediate gate opening with a conformal deposition of the organic planarizing layer within the initially created intermediate gate opening. Note also that after desired subsequent processing, the intermediate gate opening may be patterned to create a gate opening to facilitate formation of conductive contact or contact metallization to electrically connect to the one or more gate structures of the transistor.

Further, as will be discussed subsequently, after the desired number of intermediate gate openings have been created over the desired number of gate structures, for instance, gate structure 104, the semiconductor fabrication processing of the semiconductor structure proceeds by patterning to create one or more electrically conductive contacts or contact metallization to electrically connect, to one or more source and drain regions of the transistor. This contact metallization may be accomplished by sequentially patterning the structure to create one or more source openings and one or more drain openings, over the one or more source and drain regions. Although not depicted in the figures, note that the patterning process to create the source openings and drain openings over any additional subsequent source regions and drain regions in varying cross-sections may be repeated, after creating the initial source opening and drain opening, to achieve the desired number of source openings and drain openings.

Figure 5:
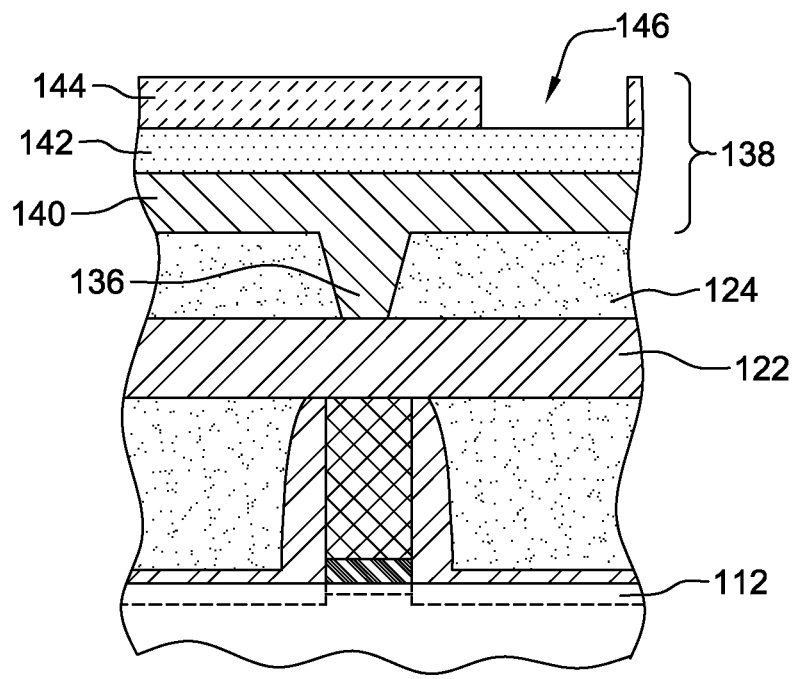
FIG. 5 depicts one example of the intermediate structure of FIG. 4 after a patterned opening has been created over the source region, in accordance with one or more aspects of the present invention.

Accordingly, as illustrated in FIG. 5, one or more lithographic processing steps may be performed to etch through the multilayer structure of FIG. 1, to create electrically conductive contacts or contact metallization to electrically connect to one or more source and drain regions of the transistor. These lithographic processing steps may be performed by providing a sacrificial lithographic stack 138 over additional dielectric layer 124. As discussed in connection with FIG. 3, the sacrificial lithographic stack 138 may include an organic planarizing layer 140 disposed over additional dielectric layer 124, an anti-reflective coating 142 disposed over organic planarizing layer 140, and a photoresist layer 144 disposed over anti-reflective coating 142, with organic planarizing layer 140 being spin coated within intermediate gate opening 136 of additional dielectric layer 124. This sacrificial lithographic stack 138 advantageously facilitates in subsequent patterning to create intermediate source openings and drain openings over the source region and drain region sequentially, by etching through the additional dielectric layer, the second layer of protective material, the dielectric layer and stopping at the first layer of protective material. In one example, organic planarizing layer 140, having a thickness of about 100 nanometers to about 200 nanometers, may be any of those conventionally employed during a pattern transfer process and may include an organic polymer, for example, polyacrylate resin, epoxy resin, phenol resin, polyamide resin, polyimide resin, unsaturated polyester resin, polyphenylenether resin, polyphenylenesulfide resin, or benzocyclobutene (BCB). In another example, anti-reflective coating material layer 142, having a thickness of about 20 nanometers to about 40 nanometers, may include materials having silicon and nitrogen, silicon and oxygen, or silicon, oxygen and nitrogen, or an organic polymer, or combinations thereof. The layer of photo resist 144, having a thickness in the range of about 100 nanometers to about 200 nanometers, may include a conventional positive photo resist material, such as, for example, organic photo resist materials, non-organic materials or combinations thereof.

Continuing further with FIG. 5, the patterning of the sacrificial lithographic stack 138 may then proceed by selectively patterning to remove a portion of photo resist layer 144 over, for example, source region 112. This patterning process may be performed by employing a mask (not shown). As discussed in connection with FIG. 3, in one example, a mask may be used to expose select portions of photo resist layer 144 with an exposure source from, for instance, a conventional stepper lithography system, resulting in the polymerization of the exposed photo resist layer. The portions of the exposed or polymerized photo resist layer may then be developed using conventional wet chemistry, to create patterned opening 146 within the photo resist layer 144, over source region 112.

Figure 6:
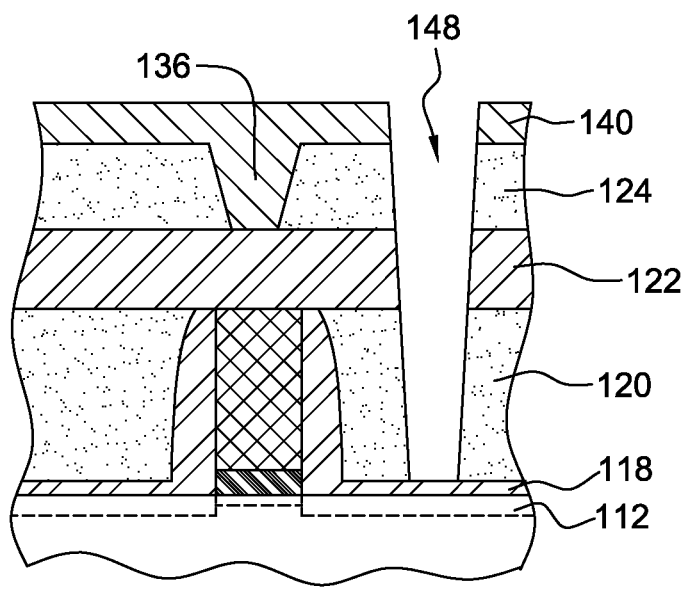
FIG. 6 depicts one example of the intermediate structure of FIG. 5 after patterning and creating an intermediate source opening, in accordance with one or more aspects of the present invention.

As shown in FIG. 6, patterned opening 146 (see FIG. 5) within the photo resist layer, may subsequently be used as a hard mask to transfer the pattern to underlying dielectric layer 120 by extending downward through the underlying anti-reflective coating material layer 142 and organic planarizing layer 140 of FIG. 5. The transfer of the pattern further proceeds to etch through additional dielectric layer 124 and second layer of protective material 122, subsequently etching through dielectric layer 120, and stopping at the first layer of protective material 118, thereby creating intermediate contact opening 148 that extends through dielectric layer 120. Note that this transfer may be accomplished without affecting intermediate gate opening 136, that is filled with organic planarizing layer 140, and may be performed as one or more process steps, such as, for example, an anti-reflective coating open step and an organic planarizing layer open step, followed by an etching process, which may be achieved by a conventional plasma etching process. In one example, if the dielectric layer 120 were to include an oxide material and first layer of protective material 118 were to include a nitride material, a $C_xF_y$-based chemistry may be employed along with additional process gases such as, for example, carbon monoxide (CO), oxygen ($O_2$) and argon (Ar) to selectively etch through dielectric layer 120 and to stop at first layer of protective material 118. Note that the etching process for the second layer of protective material 122, as well as to etch through dielectric layer 120, are selective to any conventional organic etching processes so as not to affect intermediate gate opening 136, filled with organic planarizing layer 140.

Figure 7:
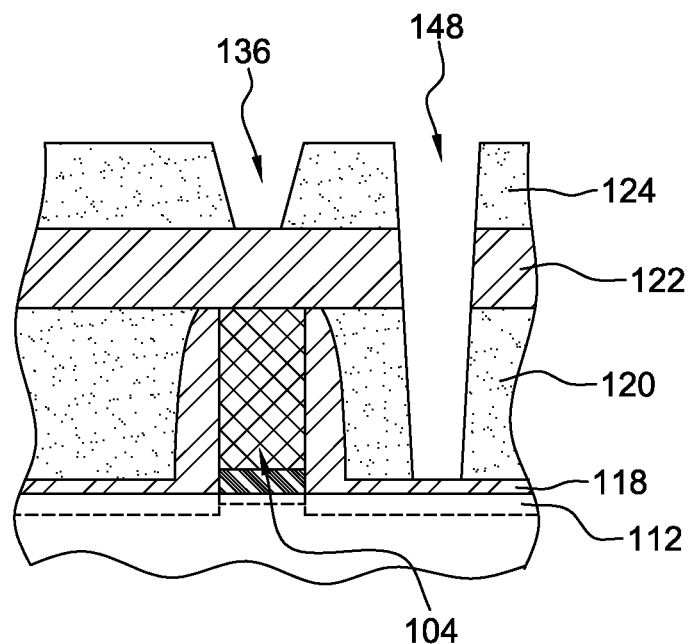
FIG. 7 depicts one example of the intermediate structure of FIG. 6 after removal of residual lithographic stack materials, in accordance with one or more aspects of the present invention.

As depicted in FIG. 7, the residual layer(s) of the lithographic stack, in this example, organic planarizing layer 140 (see FIGS. 5 and 6) are subsequently removed to again reveal intermediate gate opening 136 over corresponding gate structure 104. The residual layers may be removed, for example, by employing dry chemistries involving reactive plasma, such as, for example, oxygen or nitrogen ($N_2$)/hydrogen ($H_2$) plasma in an ashing environment. In another example, the ashing environment may also include wet process such as sulfuric acid ($H_2SO_4$) and hydrogen peroxide ($H_2O_2$) mixture, commonly referred to as SPM mixture clean. Note that the ashing process performed to remove the organic planarizing layer 140 (see FIG. 6) will not oxidize or damage underlying regions such as source region 112 and drain region 114 as the underlying regions are protected by first layer of protective material 118.

Figure 8:
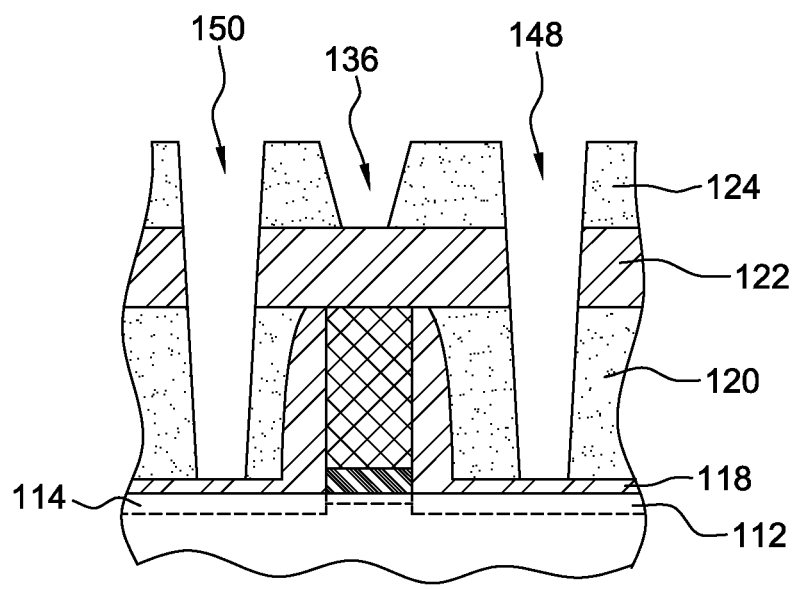
FIG. 8 depicts one example of the intermediate structure of FIG. 7 after patterning and creating an intermediate drain opening, in accordance with one or more aspects of the present invention.

As illustrated in FIG. 8, an intermediate drain opening 150 may be created subsequently over drain region 114 using process steps similar to that used to create intermediate source opening 148, while protecting opening 148 and intermediate gate opening 136. For example, a lithographic stack may be provided to protect the initially created intermediate source opening 148 along with intermediate gate opening 136, creating a pattern and etching through the lithographic stack and the underlying layers, as described above and which for the sake of brevity, will not be described again. Note that the intermediate source openings and drain openings, e.g., openings 148 and 150, have been created over the first layer of protective material 118 while the intermediate gate opening 136 has been created over the second layer of protective material 122.

Figure 9:
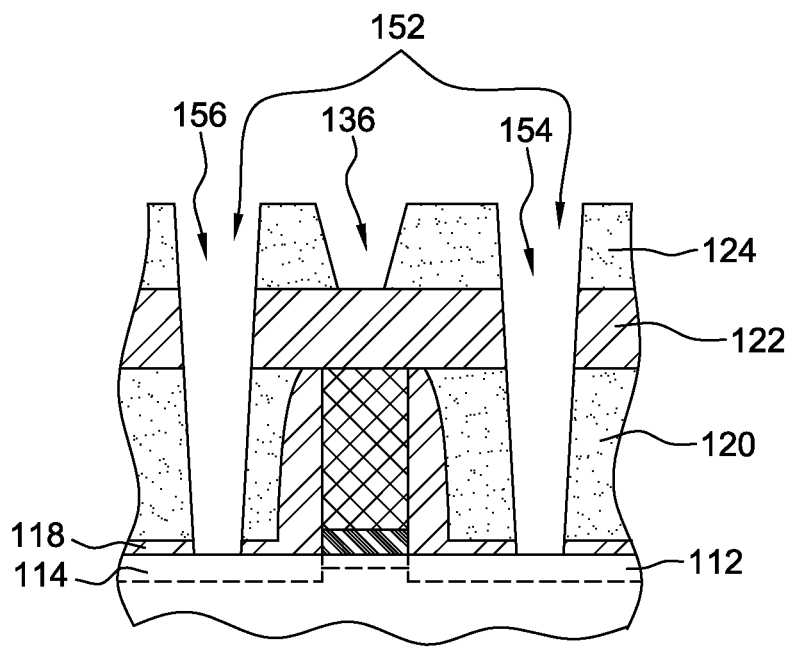
FIG. 9 depicts one example of the intermediate structure of FIG. 8 after etching to create a source opening and a drain opening, in accordance with one or more aspects of the present invention.

Referring to FIG. 9, first layer of protective material 118 is selectively removed from within the intermediate source and drain openings 148 and 150 (see FIG. 8), thus extending the source and drain openings (generally, extended openings 152) to openings 154 and 156 reaching down to the various source and drains, which openings will subsequently contain one or more conductive contacts (also referred to as contacts) over the source region and drain region. Any suitable conventional etching process, such as, for example, isotropic or anisotropic dry etching processes may be performed to remove first layer of protective material 118. In a specific example, anisotropic dry etching processes may include processes, such as, for example, reactive ion etching or plasma etching involving process gases, such as nitrogen trifluoride ($NF_3$) and hydrogen ($H_2$). Note that the etching process performed to remove the first layer of protective material 118 from within the intermediate source and drain openings may also remove a portion of the material from the second layer of protective material 122 above the gate stack. However, the relatively thicker second layer of protective material 122 as compared to the first layer of protective material 118 prevents etching through the second layer of protective material, resulting in protecting the underlying gate structure 104 during subsequent fabrication processing. Alternatively, if the first layer of protective material 118 and second layer of protective material 122 were to be substantially different materials, first layer of protective material 118 may selectively be removed in presence of second layer of protective material 122. In one example, if first layer of protective material 118 were to include, for instance, hafnium oxide ($HfO_2$) and second layer of protective material 122 were to include, for instance, silicon nitride (SiN), a boron trichloride ($BCl_3$) based dry etch chemistry may be employed to selectively etch the first layer of protective material in presence of second layer of protective material. By way of example only, this selectivity in the etching processes advantageously facilitates in creating silicide selectively within the exposed source and drain and preventing exposure of the created silicide to any subsequent ashing processes that may cause damage to silicide, and thereby improving the performance of the semiconductor device.

Figure 10:
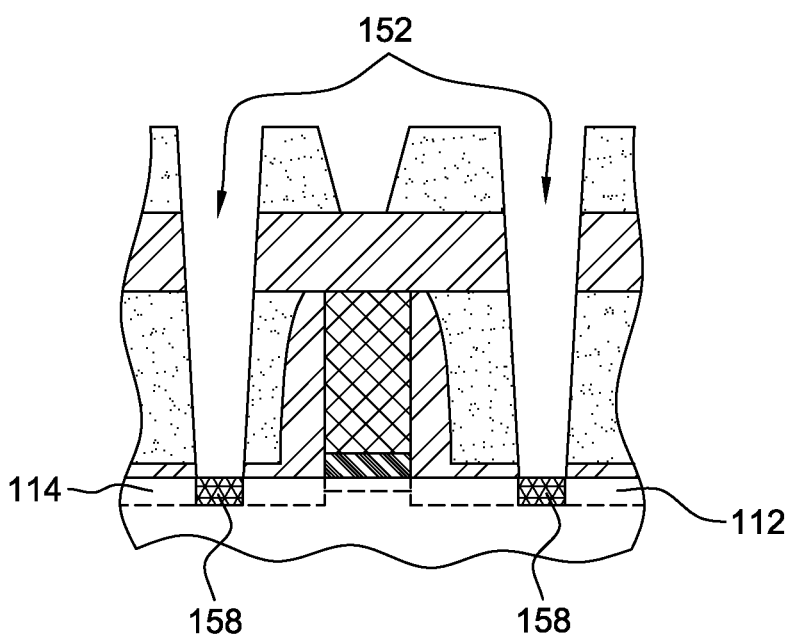
FIG. 10 depicts one example of the intermediate structure of FIG. 9 after creating silicide in the source opening and the drain opening, in accordance with one or more aspects of the present invention.

As shown in FIG. 10, a silicide 158 is selectively formed in the source region 112 and drain region 114. Silicide 158 may be formed from a refractory metal, such as, for example, cobalt, nickel, titanium, tantalum, platinum, palladium, rhodium and mixtures thereof that have been chemically reacted with silicon, e.g., the silicon of source region 112 and drain region 114, exposed from within source openings and drain openings 152. In a specific example, nickel or a nickel-containing alloy may be deposited within the source and drain openings to allow contact with the silicon surface of the underlying source region 112 and drain region 114 and annealed at a temperature of about 450° C., for a time period sufficient to cause the nickel alloy layer to react with the underlying silicon, to form nickel silicide or a nickel alloy silicide using, for example, a rapid thermal anneal (RTP) process. As one skilled in the art will understand, unreacted nickel or nickel-containing alloy may be removed from the intermediate gate opening and from other regions of the structures on the semiconductor wafer by performing a selective etching process. This etching process is highly selective to remove the unreacted metal while not attacking the reacted silicide areas.

Figure 11:
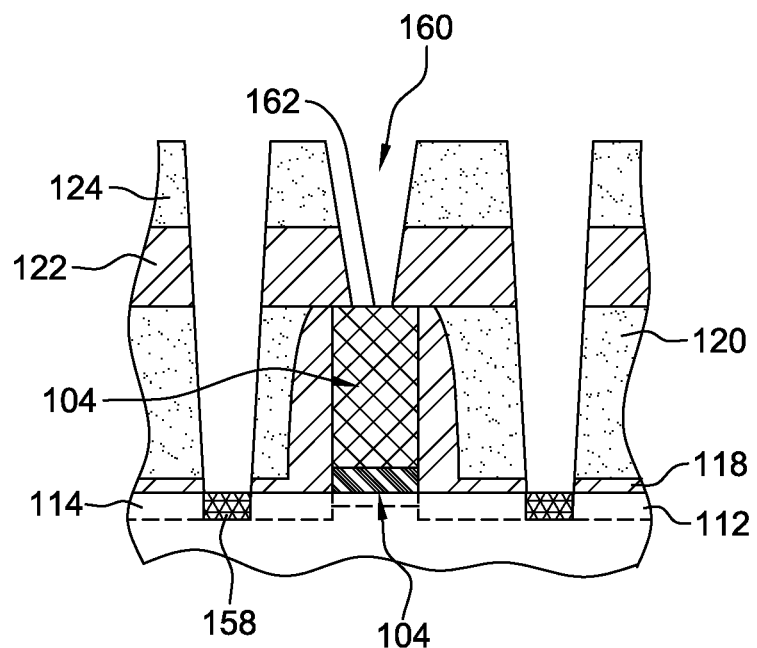
FIG. 11 depicts one example of the intermediate structure of FIG. 10 after creating a gate opening, in accordance with one or more aspects of the present invention.

As depicted in FIG. 11, one or more etching processes are performed to extend the intermediate gate openings through the second layer of protective material, to create gate openings 160, so as to facilitate the formation of conductive contacts or contact metallization to electrically connect to the gate structure 104 of the transistors. Note that the etching process(es) advantageously facilitate in exposing the upper surface 162 of underlying gate structures 104. Any conventional dry etching process, such as, for example, reactive ion etching or plasma etching, may be performed. In a specific example, reactive ion etching may be performed using a remote plasma involving process gases, such as nitrogen trifluoride ($NF_3$) and hydrogen ($H_2$). Note that, as discussed above, the fabrication of intermediate gate opening 136 (see FIG. 9) advantageously facilitates in defining gate openings 160 without the use of additional conventional lithographic and ashing processes, while avoiding oxidation of the subsequently formed silicide during the ashing processes.

Figure 12:
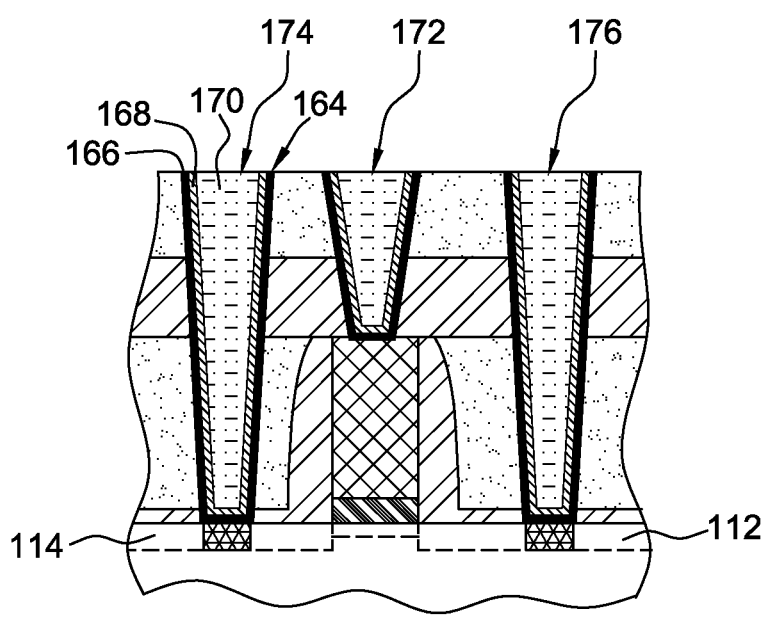
FIG. 12 depicts one example of the intermediate structure of FIG. 11 after creating tungsten contacts in the source opening, the drain opening and the gate opening, in accordance with one or more aspects of the present invention.

The semiconductor fabrication proceeds with the contact metallization process to create electrical contacts to electrically connect to the gate structures and the source and drain regions of the transistors, as depicted in FIG. 12. In one example, if the contact metal (or conductive contact) is to include tungsten, which has poor adhesion to the underlying layers, gate openings 160 (see FIG. 11) and source and drain openings 152 (see FIG. 10), may be lined with one or more contact liners 164. As used herein "contact liners" refers generally to any film or layer lining part or all of the gate, source and/or drain openings which may form part of the resultant contact structure, and may include one or more conformally-deposited layers, such as a gettering layer 166, and a barrier/adhesive layer 168 disposed over gettering layer 166. Note that, as one skilled in art will understand, these one or more conformally-deposited layers may usually have higher resistivity as compared to the conventionally subsequently filled contact material such as copper (Cu), tungsten (W) or aluminum (Al). Gettering layer 166 may be deposited, to ensure that oxygen (for instance, formed due to exposure of the underlying silicide to ambient conditions), remaining after various post pre-clean conditions, such as, for example, argon (Ar) sputter, SiCoNi dry etch conditions, is gettered of the underlying silicide layer and also to decrease subsequent contact resistance. Gettering layer 166, which may be deposited using conventional process(es), such as, for example, ionized metal plasma (IMP), or physical vapor deposition processes, for example, radio-frequency physical vapor deposition (RFPVD), may have a thickness of about 2 nanometers to about 8 nanometers, and be fabricated of, for example, ruthenium (Ru), an alloy of ruthenium, cobalt (Co), an alloy of cobalt, titanium (Ti), an alloy of titanium, tantalum (Ta), an alloy of tantalum, palladium (Pd), rhodium (Rh), molybdenum (Mo) and the like.

Barrier/adhesive layer 168 may be deposited over gettering layer 166 to, for instance, protect the gettering layer from eroding on exposure to harsher chemistries typically employed during subsequent contact metallization, as well as to prevent oxidation due to exposure to air. Barrier/adhesive layer 168 may be deposited using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods, and may, for example, have a thickness of about 1 nanometer to about 3 nanometers. In one example, barrier/adhesive layer 168 may include titanium-based materials (e.g., TiN, TiC, TiCN, TiSiN), or tantalum-based materials (e.g., TaN, TaC, TaCN, TaSiN) or fluorine-free tungsten-based materials (e.g., WN, WC, WCN, WSiN). It should be noted that the use of a fluorine-free tungsten-based nucleation layer may eliminate the need for additional adhesive layers, such as, for example, titanium-based materials (e.g., TiN), as fluorine-free tungsten-based nucleation layers are known in the art to be good barrier/adhesive layers as well. In a specific example, titanium nitride (TiN) may be formed using a titanium precursor, such as, for example, tetrakis (dimethylamino) titanium (TDMAT) or titanium tetrachloride ($TiCl_4$) and a reagent plasma, such as, for example, nitrogen plasma during a plasma-enhanced ALD (PE-ALD) process.

Continuing further with FIG. 12, a conductive contact material 170 has been provided over contact liners 164, within gate openings 160 (see FIG. 11) and source opening and drain opening 152 (see FIG. 10), resulting in corresponding gate structure contacts 172, source contacts 174 and drain contacts 176. Note that conductive contact material 170 may be any of a variety of conductive materials, such as, for example, tungsten, copper, aluminum, etc. In the example discussed herein, it is assumed that the conductive contact material is tungsten. In one example, a bulk layer of tungsten may be provided within gate openings 160 (see FIG. 11) and source and drain openings 152 (see FIG. 10) using a bottom-up growth process. A "bottom-up" process or "bottom-up fill" is used herein to describe the deposition or the formation of a metal within the opening and the continued process of depositing or forming metal from the bottom of the opening up to the top of the opening.

In another example of the process, a tungsten nucleation layer (not shown) may be deposited over the adhesive/barrier layer 168 to facilitate the subsequent formation of the bulk tungsten material, using conventional deposition processes, such as chemical vapor deposition (CVD), atomic layer deposition (ALD) or pulsed nucleation layer deposition (PNL) deposition processes. The thickness of the nucleation layer may be about 1 nm to about 4 nm and may be deposited by, for instance, performing alternating pulsing sequences of boron-containing reducing agent and tungsten-containing precursor in presence of a reducing agent. The boron-containing reducing agents include, but are not limited to, borane ($BH_3$), diborane ($B_2H_6$), triborane, boron halides, such as, for example, boron trifluoride ($BF_3$), boron trichloride ($BCl_3$) and the like. The tungsten-containing precursors may include tungsten-containing gases, such as, for example, $WF_6$, $WCl_6$ and $W(CO)_6$ and the like, while the reducing agents may include hydrogen gas ($H_2$), silane ($SiH_4$), disilane ($Si_2H_6$), hydrazine ($N_2H_4$) and germane ($GeH_4$). In a specific example, the bulk deposition process involves a chemical vapor deposition (CVD) reaction of tungsten-containing precursor, such as tungsten hexafluoride ($WF_6$), and reducing gases, such as hydrogen ($H_2$) to produce tungsten and a byproduct, such as, for example, hydrogen hexafluoride (HF) at temperature of about 250° C. to about 400° C.

Figure 13:
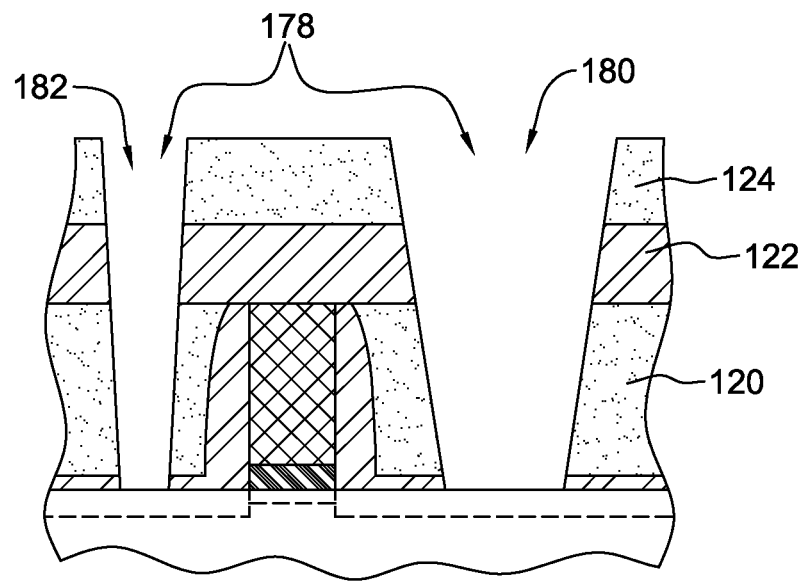
FIG. 13 depicts one alternate example of the intermediate structure of FIG. 11 after patterning and creating a source opening and a drain opening of varying widths, in accordance with one or more aspects of the present invention.

Alternatively, referring to FIG. 13, the semiconductor fabrication processing of the semiconductor structure may include patterning of the structure to create one or more conductive contacts or contact metallization of varying widths to electrically connect to one or more source region and drain regions. Note that this contact metallization may be accomplished by sequentially patterning the structures to create one or more source openings and drain openings of varying sizes, prior to creating the conductive contacts to electrically connect to one or more gate structures of the transistors. In one example, the structure may be patterned to create, for example, one or more source and drain openings 178, e.g., source opening 180 and drain opening 182 (note that the source and drain could be switched), using process steps, such as, for example, providing a lithographic stack, creating a pattern and etching through the lithographic stack and the underlying layers, as described above and which for brevity sake, will not be described again. Note that in this example, although source opening 180 has been depicted in the drawings, to be smaller as compared to drain opening 182, the size of the source opening and the drain opening could either be substantially similar or different for one or more semiconductor devices, depending on the semiconductor device being fabricated.

Figure 14:
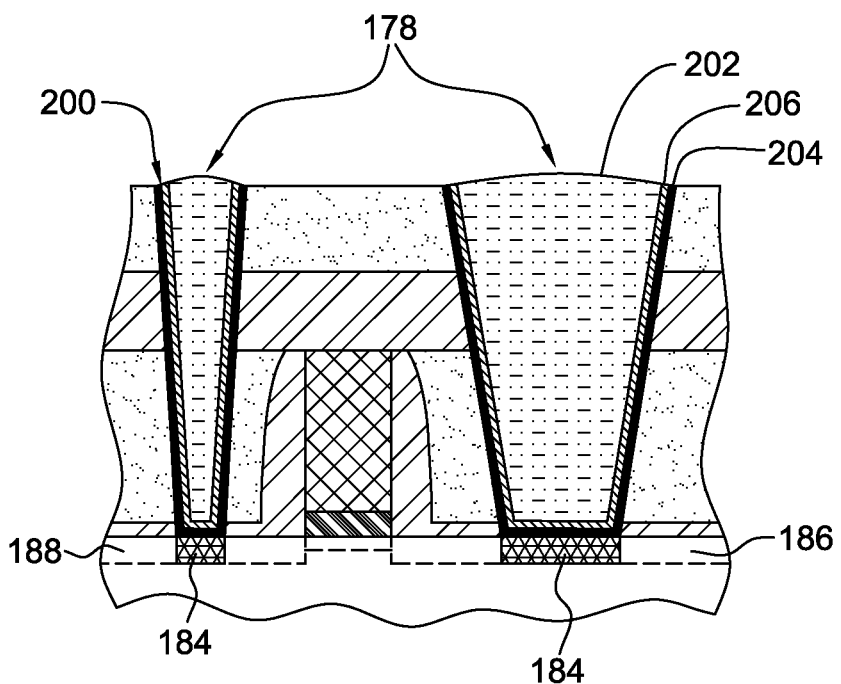
FIG. 14 depicts one example of a resultant structure of FIG. 13 after creating silicide and tungsten contacts in the source opening and the drain opening of varying widths, in accordance with one or more aspects of the present invention.

A silicide 184 is formed within source region 186 and drain region 188 below the respective source and drain openings, as illustrated in FIG. 14. Silicide 184 may be formed from a refractory metal, such as, for example, cobalt, nickel, titanium, tantalum, platinum, palladium, rhodium and mixtures thereof that have been chemically reacted with, for example, the silicon of drain region 188 exposed within drain openings 182. In a specific example, nickel alloy may be deposited within the source and drain openings so as to allow contact with the silicon surfaces of the underlying source region and drain regions, and annealed at a temperature of about 450° C., for a time period sufficient to cause the nickel alloy layer to reach the underlying silicon, and form nickel silicide using, for example, a rapid thermal anneal (RTP) process.

Continuing further with FIG. 14, the semiconductor processing proceeds with the contact metallization process to create electrical contacts within source and drain openings 178, electrically connecting to the source and drain regions of the transistors. As discussed above, process steps to create the electrical contacts include conformally depositing contact liners 200 and providing conductive contact material 202 filling the lined openings. Note that, as previously described, conformally depositing contact liners 200 may include conformally depositing, for example, a gettering layer 204 within source and drain openings 178 and conformally depositing barrier/adhesive layers 206 over gettering layer 204. Note that these layers may be formed using a variety of different materials and techniques, such as, for example, atomic layer deposition (ALD) and chemical vapor deposition (CVD). The thickness of the layers may also vary, depending upon the particular application. In one example, a bulk layer of tungsten may be provided within source and drain openings 178 (see FIG. 13) using a bottom-up growth process.

Figure 15:
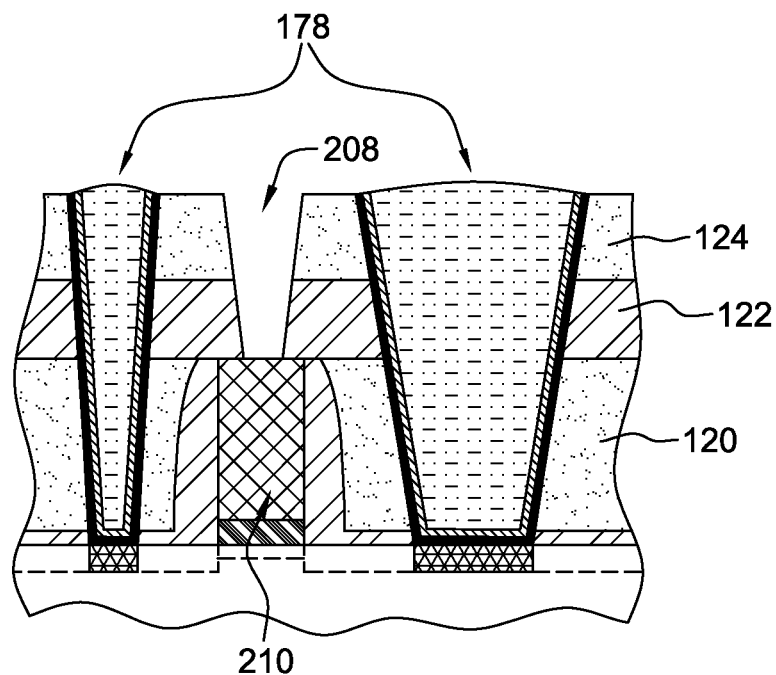
FIG. 15 depicts an alternate example of the intermediate structure of FIG. 14 after creating a gate opening, in accordance with one or more aspects of the present invention.

Next, as illustrated in FIG. 15, one or more processes are performed to create gate opening 208 over gate structure 210, so as to facilitate the formation of conductive contacts or contact metallization to electrically connect to gate structure 210 of the transistor, without affecting the adjacent electrical contacts created within source and drain openings 178. In one example, the one or more processes include etching through additional dielectric layer 124 and second layer of protective material 122 to create gate opening 208. Any suitable etching process, such as, for example, anisotropic dry etching processing, for example, reactive ion etching, may be employed to selectively remove the various layers to define gate opening 208.

Figure 16:
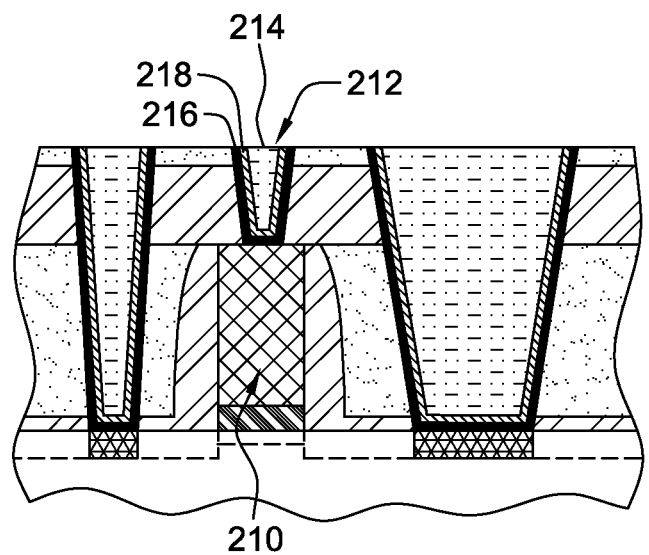
FIG. 16 depicts one example of the intermediate structure of FIG. 15 after creating a tungsten contact in the gate opening, in accordance with one or more aspects of the present invention.

Referring to FIG. 16, the contact metallization process is performed to create electrical contacts within gate openings 208 (see FIG. 15), to electrically connect to gate structure 210 of the transistor. As discussed above in connection with FIG. 12, process steps to create the electrical contacts include conformally depositing contact liners 212 and providing conductive contact material 214 over contact liners 212. Note that conformally depositing contact liners 212 include conformally depositing gettering layer 216 within gate opening 208 (see FIG. 16) and conformally depositing barrier/adhesive layers 218 over gettering layer 216. Note that these layers may be formed using a variety of different materials and techniques, such as, for example, atomic layer deposition (ALD) and chemical vapor deposition (CVD). The thickness of the layers may also vary, depending upon the particular application. In one example, a bulk layer of tungsten may be provided within gate openings 208 (see FIG. 15) using a bottom-up growth process.

Figure 17:
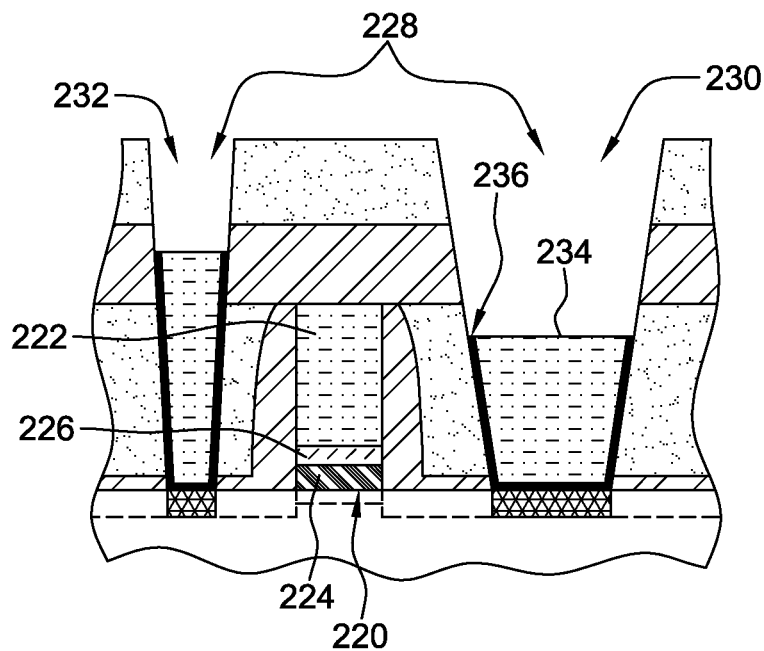
FIG. 17 depicts one alternate example of the intermediate structure of FIG. 13 after partial recessing of the tungsten contacts in the source opening and the drain opening, in accordance with one or more aspects of the present invention.

Alternatively, as depicted in FIG. 17, where the gate structure includes metal gate material, for example, tungsten, common partial filling of the transistor source, drain and gate openings may be performed. In a specific example, gate structure 220 may also include a metal gate material 222, such as, for example tungsten, along with underlying one or more conformally deposited layers, such as gate dielectric layer 224 and one or more work function layers 226 deposited over gate dielectric layer 224. In such an example, the contact metallization may be performed to create electrical contacts within source and drain openings 228, to form partial source and drain contacts 230 and 232, using, for example, process conditions as described in connection with FIG. 14. The source contact and drain contact may be partially recessed by employing one or more controlled etching processes, to selectively remove a portion of conductive contact material and underlying contact liners. In a specific example, the etching processes may include process gases involving activated fluorine species at a predetermined temperature to partially etch conductive contact material 234 and underlying contact liners 236. In one example, the activated fluorine species may be generated from $NF_3/Ar$ or $NF_3/He$ plasma in a remote plasma source or using other approaches. Note that the portion of conductive contact material 234 and contact liners 236 remaining in thinner electrical contact 232 is relatively taller compared to portion of conductive contact material 230 and contact liners 236 remaining in thicker electrical contact 230, so as to reduce the loading effect, as is understood in the art. The height of the portion of conductive contact material 234 and liners 236 remaining in the source contact 230 may be in the range of about 10 nanometers to about 50 nanometers, while the portion of contact material 234 and liners 236 remaining in the drain contact 232 may be in the range of about 10 nanometers to about 80 nanometers.

Figure 18:
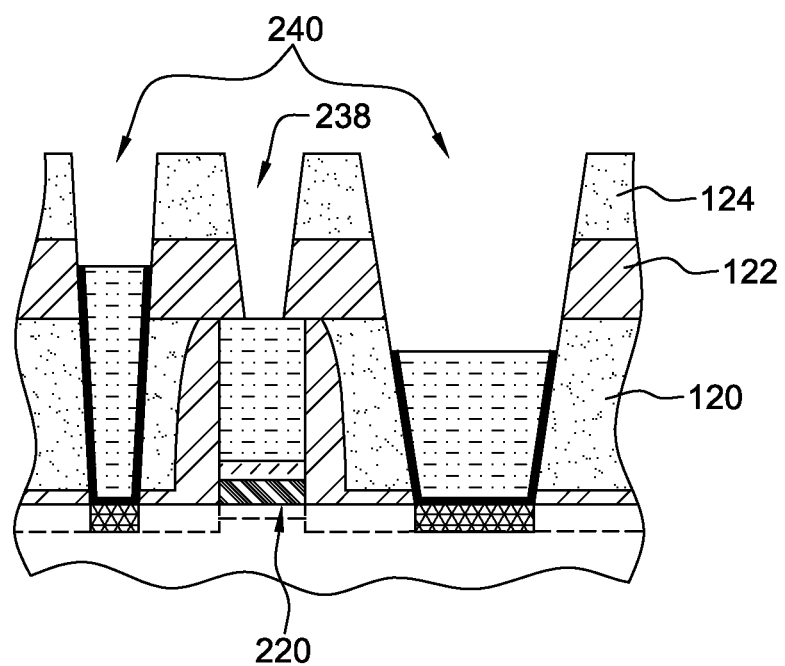
FIG. 18 depicts one example of the intermediate structure of FIG. 17 after creating a gate opening, in accordance with one or more aspects of the present invention.

Next, one or more processes are performed to create gate opening 238 over gate structure 220, so as to facilitate the formation of conductive contacts or contact metallization to electrically connect to gate structure 220 of the transistor, as depicted in FIG. 18. In one example, one or more processes include etching through additional dielectric layer 124 and second layer of protective material 122 to create gate opening 238. Any suitable etching processes, for example, anisotropic dry etching processing and/or reactive ion etching, may be employed to selectively remove the various layers to define gate opening 238. Note that the silicide 184 of FIG. 14 remains unaffected during any subsequent gate patterning and/or ashing processes, due to the silicide being protected by the partially etched conductive contact material 234.

Figure 19:
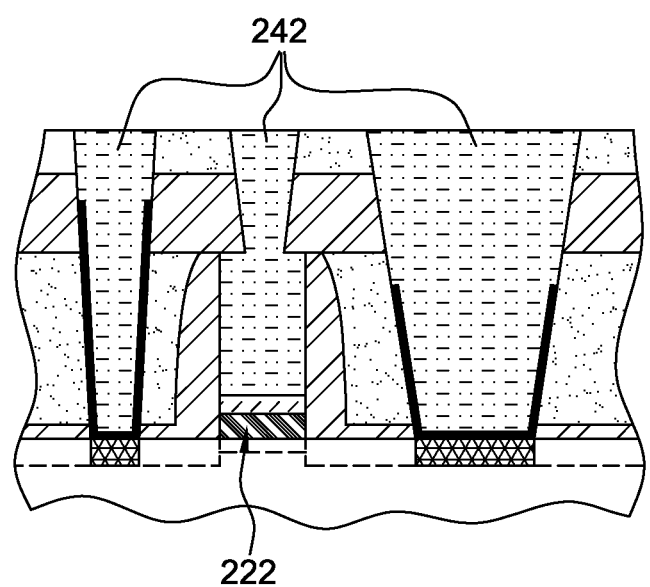
FIG. 19 depicts an alternate example of the intermediate structure of FIG. 18 after creating a tungsten contact in the gate opening, in accordance with one or more aspects of the present invention.

Referring to FIG. 19, the contact metallization process continues to create electrical contacts within gate opening 238 (see FIG. 18) and complete the partially recessed source and drain contacts 240 (see FIG. 18). Note that contact liners conventionally provided within gate opening 238 may not be required during the formation of electrical contacts over gate structure 222, in the case of at least the top metal gate material being tungsten. In one example, the conductive contact material 242 may be conformally deposited using a conventional bottom-up growth process, as described previously. Note that, in one specific example, the bottom-up growth may be performed by selectively growing tungsten on the etched tungsten, which provides nucleation sites to grow large grain tungsten. This bottom-up growth process advantageously increases the volume of low resistance material, for instance, tungsten material, and refrains from the use of high resistive contact liners from the sidewalls of the contact structures, thereby reducing the contact plug resistance. Note that these layers may be formed using a variety of different materials and techniques, such as, for example, atomic layer deposition (ALD) and chemical vapor deposition (CVD). The thickness of the layers may also vary, depending upon the particular application.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A transistor, comprising:
a semiconductor substrate;
a source region, a drain region and a channel region therebetween;
a metal gate above the channel region, at least a top conductive portion of the metal gate comprising tungsten;
openings through at least one layer of one or more materials to the source region, drain region and gate;
a tungsten contact filling the gate opening, wherein the gate contact is in direct contact with the top conductive portion of the gate;
silicide for the source and drain regions;
a liner lining only a portion that is less than all of the inner surfaces of the source and drain openings; and
tungsten contacts filling the partially lined source and drain openings.

2. The transistor of claim 1, wherein the transistor comprises a FinFET having at least one fin coupled to the substrate, a top portion of the at least one fin comprising the source region, the drain region and the channel region, and wherein the metal gate encompasses the channel region.

3. An intermediate semiconductor structure, comprising:
a semiconductor substrate;
a source region, drain region and channel region therebetween;
a metal gate above the channel region, at least a top conductive portion of the metal gate comprising tungsten;
a first layer of protective material over the source region and the drain region; and
a second layer of protective material over the gate;
wherein the first protective layer acts as an etch stop for creating intermediate openings to the source region and the drain region, and wherein the first and second protective layers are configured to allow punch-through of the first protective layer while preventing etching through the second protective layer.

4. The intermediate semiconductor structure of claim 3, wherein the first layer of protective material and the second layer of protective material are both susceptible to a common etch, and wherein a thickness of the second layer of protective material is greater than that of the first layer of protective material, the thickness of the second layer of protective material preventing fully etching through the second layer of protective material.

5. The intermediate semiconductor structure of claim 4, wherein the first layer of protective material and the second layer of protective material are a same material.

6. The intermediate semiconductor structure of claim 3, wherein the first layer of protective material is susceptible to an etch selective to the second layer of protective material.

7. The intermediate semiconductor structure of claim 3, wherein the second layer of protective material is more etch resistant than the first layer of protective material.

8. The intermediate semiconductor structure of claim 3, wherein the second layer of protective material has a different silicon-to-nitride ratio than the first layer of protective material, such that punch-through of the first layer of protective material does not punch-through the second layer of protective material.

9. An intermediate semiconductor structure, comprising:
a semiconductor substrate;
a source region, drain region and channel region therebetween;
a metal gate above the channel region, at least a top conductive portion of the metal gate comprising tungsten;
openings to the source region and the drain region;
silicide in the source region and the drain region; and
an intermediate gate opening exposing at least a portion of a layer of protective material directly above the metal gate without exposing the metal gate.

10. The intermediate semiconductor structure of claim 9, wherein the layer of protective material comprises silicon nitride that is relatively thick compared to other layers in the intermediate semiconductor structure.

* * * * *